(12) United States Patent
Anthony et al.

(10) Patent No.: US 7,109,784 B2
(45) Date of Patent: Sep. 19, 2006

(54) GATE BIAS CIRCUIT FOR MOS CHARGE COUPLED DEVICES

(75) Inventors: Michael P. Anthony, Andover, MA (US); Jeff Venuti, Somerville, MA (US)

(73) Assignee: Kenet, Inc., Woburn, MA (US)

( * ) Notice: Subject to any disclaimer, the term of this patent is extended or adjusted under 35 U.S.C. 154(b) by 197 days.

(21) Appl. No.: 10/870,488

(22) Filed: Jun. 17, 2004

(65) Prior Publication Data
US 2005/0280025 A1   Dec. 22, 2005

(51) Int. Cl.
*G05F 1/10* (2006.01)
(52) U.S. Cl. .................................................. 327/543
(58) Field of Classification Search ................ 327/271, 327/277, 284, 530, 534, 535, 538, 540, 543, 327/564, 565, 566
See application file for complete search history.

(56) References Cited

U.S. PATENT DOCUMENTS 4,831,257 A * 5/1989 McClelland et al. ..... 250/338.1

5,140,623 A * 8/1992 Imai et al. ..................... 377/60

* cited by examiner

*Primary Examiner*—Jeffrey Zweizig
(74) *Attorney, Agent, or Firm*—Hamilton, Brook, Smith & Reynolds, PC

(57) ABSTRACT

A biasing circuit for use with a Charged Coupled Device (CCD) that creates a gate bias voltage by maintaining a model or surrogate representation of the surface potentials within the CCD storage and barrier regions. In one embodiment the invention is a bias circuit that includes at least a first and second model transistor for modeling the two regions. The first model transistor is connected to a supply voltage to provide a first reference voltage at a first node, and models the first charge storage region. A resistive circuit element is coupled between the first node N1 and a second node N2 in order to allow a step voltage to be developed. The second model transistor is in turn connected to the second node N2 and provides the bias voltage at an output portion that can be used to control the gate of the barrier region. The model circuit therefore allows a proper bias voltage to be maintained through process and operating condition variations.

15 Claims, 2 Drawing Sheets

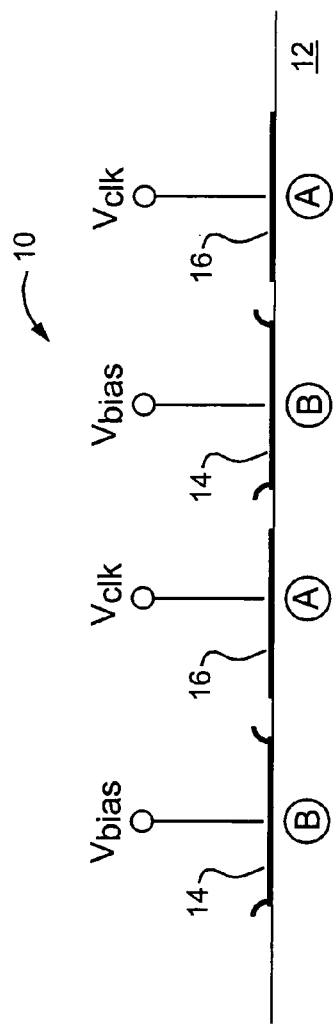
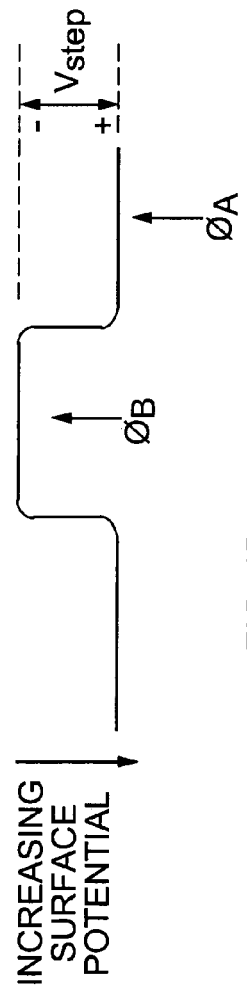
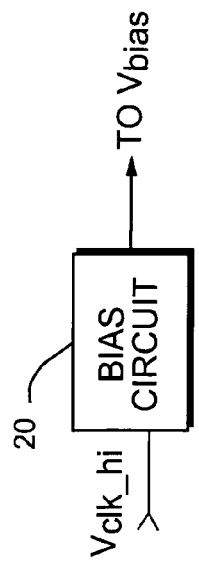

GATE BIAS CIRCUIT FOR MOS CHARGE COUPLED DEVICES

BACKGROUND OF THE INVENTION

Charged Coupled Devices (CCDs) are well known monolithic semiconductor devices that find wide application in electronic products and components such as cameras, audio and video media players, memory circuits, analog-to-digital converters and the like. A CCD typically consists of a Metal Oxide Semiconductor (MOS) structure in which minority charge carriers are stored in a spatially defined depletion region (also referred to as a "potential well") beneath a gate. CCDs can thus be thought of as charge storing devices similar to MOS capacitors. In a typical structure several of these devices are arranged closely together in a row such that charge can be transferred from one to the next. A clock circuit provides the drive signals to the gates that are necessary to move the stored charges along the row in such a way that charge moves from one potential well to the next.

The MOS structures are typically formed by depositing a highly conductive layer of polysilicon on top of an insulting layer of silicon dioxide ("oxide") covering a p-type substrate. In this way a surface channel CCD is formed. By applying a positive voltage to the polysilicon gate (positive with respect to the substrate), an electric field is generated within the structure. Any conducting electrons close to the surface will thus be attracted towards the gate, accumulating at the silicon/oxide interface, while the holes are pushed into the substrate. This forms a storage region or potential well for electrons beneath each gate.

A so called buried layer CCD is created by incorporating a thin n-doped layer of silicon underneath the oxide. The buried layer is fully depleted in normal operation and thus moves the charge storage region even deeper into the substrate and away from the oxide interface.

The extent or depth of each storage region is also determined by the applied gate voltage, which is turned on and off as required to clock the charge along the row. Careful attention must therefore be paid to the voltage levels applied to the gate, since it is these voltage levels that establish the surface potentials of the channels formed beneath the gates. Thus, these voltages control such properties as charge capacity of the channel, linearity, and charge transfer efficiency between wells. Very often, gate bias voltages are generated as a compensated Direct Current (DC) voltage level, to create a bias level that is stable over temperature and supply voltage.

Several attempts have been made in the prior art to compensate bias voltages for variations in operating conditions. For example, U.S. Pat. No. 4,831,257 issued to McClelland, et al., describes a technique for biasing the gate of an MOS transistor to compensate for variations in the applied supply voltage. A feedback circuit compares the supply voltage to a reference voltage and adjusts a bias voltage to compensate for detected changes in the supply voltage.

U.S. Pat. No. 5,140,623 issued to Imai, et al. describes an input bias circuit for a CCD array. This bias circuit uses a voltage inverting amplifier having an output node connected to a floating diffusion region of a CCD device. A comparator then compares this voltage level, as supplied to the diffusion region, against the voltage of an input signal supplied to an input gate electrode and a level generated by a low level signal generator. The potential level of the input signal of the CCD register is then controlled using the result of this comparison.

However, neither of these prior art techniques recognize the importance of considering both the voltage level of the clock signal applied for charge transfer, as well as the threshold bias voltage of the CCD devices, in order to determine an appropriate surface potential of the intermediate devices.

SUMMARY OF THE INVENTION

As a result, although prior art approaches may be able to properly bias a particular ideal instantiation of a CCD circuit, they are not guaranteed to be able to do so for many instantiations of the same circuit, such as typically happens with variations in fabrication process parameters.

Thus, maintaining control over the applied gate voltage alone does not ensure optimum performance from a CCD. In a clocked MOS CCD circuit, it is the voltage level of the clock signal applied for charge transfer, as well as the threshold voltage applied to the storage wells, that determines the appropriate surface potential for the intermediate devices.

A better approach would be to determine the actual operating threshold voltage of a particular MOS device, as well as any shifts in supply voltage due to actual operating conditions. Thus, what is needed is a way to consistently establish an appropriate surface potential, even with variation in operating conditions.

The present invention is a biasing circuit that creates a gate bias voltage (Vbias) that establishes an appropriate surface potential by maintaining a model or "surrogate" representation of the surface potentials within the CCD device controlled by the biasing circuit.

In accordance with the first aspect of the invention, a charge transfer device is provided that has at least a first and second charge transfer region. The first charge transfer region is used as a storage well into which signal charges are transferred. This first charge transfer region has an input source, a gate electrode, and an output portion. The second charge transfer region, which is used as a barrier to control the transfer of stored charges from the first region, has a second input source, a second input gate electrode, and a second output portion. In normal operation, a clock signal is applied to the gate electrode of the first charge transfer region, and a bias voltage is applied to the gate electrode of the second charge transfer region.

A bias circuit in accordance with the present invention includes at least a first and second model transistor for modeling the two charge transfer regions. The first model transistor is connected to a supply voltage to provide a first reference voltage at a first node N1. It is intended to model the first charge transfer region.

A resistive circuit element is coupled between the first node N1 and a second node N2. A step voltage (Vstep) is thus developed across the resistive circuit element.

The second model transistor is in turn connected to the second node N2 and provides a voltage, Vbias, at an output portion. This bias voltage is then used to control the second gate of the second charge transfer region. The second model transistor this serves to model the second charge transfer region.

In this way, through the expedient of the two model transistors, a correct bias voltage Vbias is maintained even with variations in operating conditions and process variations. That is, since the first model transistor and the second model transistor in the input bias circuit are formed in the same manner and with the same semiconductor processes as the first charge transfer region and second charge transfer region, and since they operate from the same supply voltage, any operating condition or process variations that result in different threshold bias levels of the semiconductor devices are correctly accommodated.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

FIGS. 1A and 1C are diagrams illustrating the present invention at a high level and the surface potentials that are developed in a CCD device.

FIG. 1B illustrates a timing diagram.

DETAILED DESCRIPTION OF THE INVENTION

Figure 2:
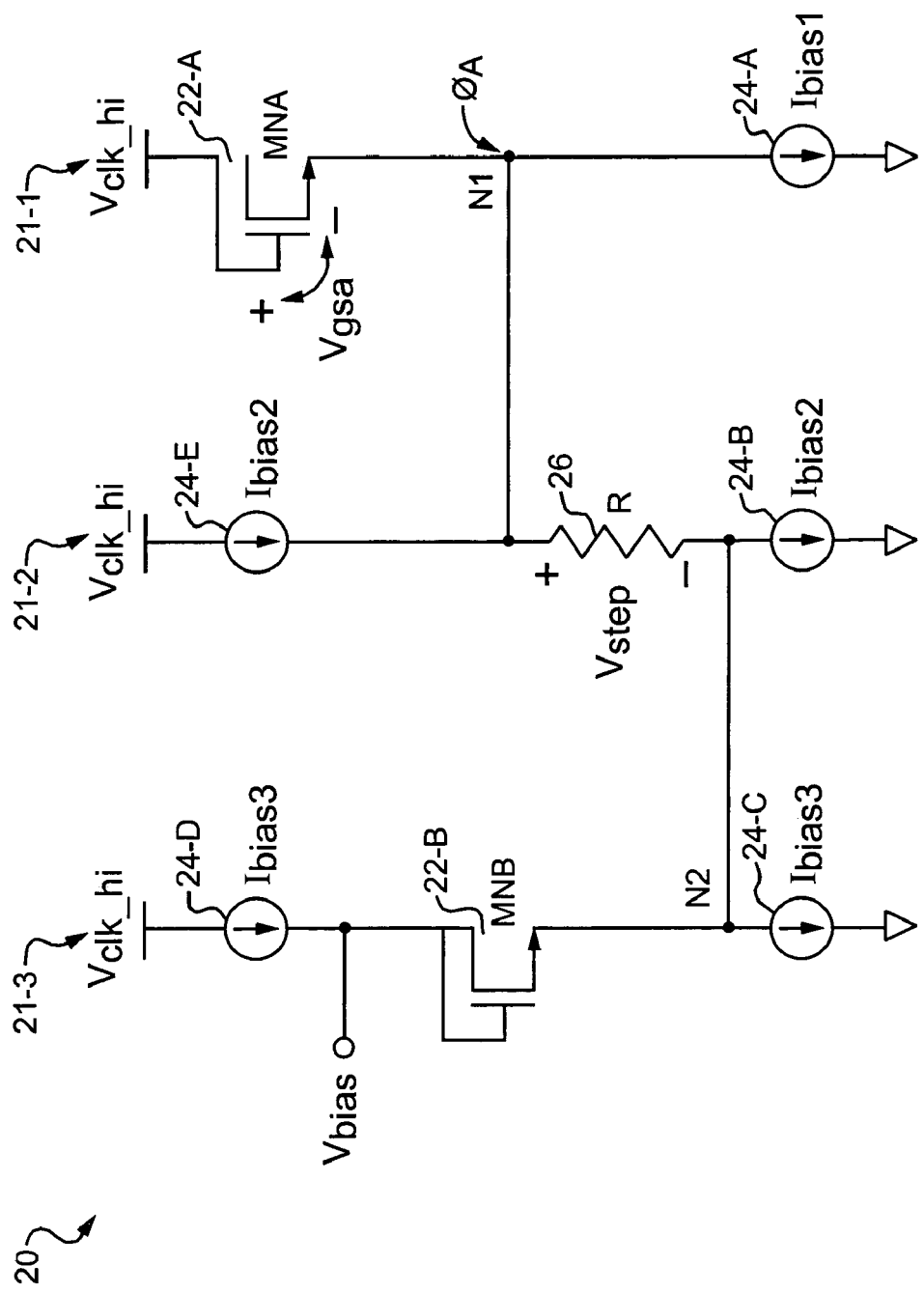
FIG. 2 is a more detailed diagram of a bias circuit according to the invention.

A description of a preferred embodiment of the invention follows.

Turning attention to FIG. 1A, there is shown a general schematic diagram of a Charged Coupled Device (CCD) array 10 and biasing circuit 20 in accordance with the present invention. The CCD 10 consists of a series of charge transfer regions 14, 16 (also referred to herein as the CCD devices) spaced closely together across a semiconductor substrate 12. In a typical arrangement, the charge transfer regions 14, 16 are formed by depositing a highly conducting layer of polysilicon on top of an insulating layer of silicon dioxide ("oxide") covering the substrate 12.

Shown in FIGS. 1A and 1C is an arrangement which is common in CCD arrays. A first set of CCD devices (indicated in the drawing by the encircled letter A, and referred herein as the charge storage regions) are formed as MOS capacitors such as by depositing a highly conducting layer of polysilicon on top of an insulating layer of silicon dioxide ("oxide") covering the wafer substrate. By applying a positive voltage to the associated polysilicon gate with respect to the substrate, an electric field is generated within a region beneath the surface. The substrate 12 is typically a lightly doped p-type substrate. Any electrons close to the surface will therefore be attracted towards the gate accumulating at the silicon/oxide interface while the holes are pushed into the substrate 12. A charge storage region 16 is thus formed underneath the gate.

The extent of this charge transfer region is determined by the voltage applied to the gate. In most instances, this voltage, Vclk, is typically clocked between an on and off state as required to shift the charge down a row of storage devices 16.

To prevent a stored charge from simply spilling into an adjacent charge storage device 16, each storage device 16 is isolated from the others by a potential barrier device 14. The barrier devices 14 are indicated by a second set of CCDS, indicated by the encircled letter B in the drawings. The barrier devices are typically formed by a different polysilicon layer with a thicker oxide layer beneath it. The thicker oxide layer results in a higher threshold voltage for the barrier devices, and in turn requires a higher gate voltage in order to create a charge storage region beneath the gate. In normal operation, the gate voltage applied to barrier B devices 14 is not high enough to serve as a storage region, therefore preventing charge from spilling sideways out of the charge storage regions of A. Along a row of charge storage devices 16, the charge packets are thus separated by using these capacitive barrier devices 14 biased to a low voltage, to form an electrostatic barrier. The voltage level applied to the barrier devices 14 is shown in the drawing as Vbias.

By changing the clock voltage, Vclk, applied to the gates of the charge transfer devices 16, it is possible to alternate between a storage mode and a mode where charge is being transferred from one storage area, A, to the next, by "spilling" it past the barrier region, B. The storage charge packets can then be moved along the CCD array 10 in a controlled manner and in such a way that the charges in various charge storage areas do not interfere with one another.

The voltage Vclk connected to the gates of storage devices 16 (A) typically follows a repeating clocking sequence of a low to high transition followed by a high to low transition. The low voltage value of the clock signal is referred to as Vclk_lo; the high voltage value of the clock signal is referred to as Vclk_hi. Note that Vclk_hi may or may not be set to the same as a supply voltage Vdd.

In the example of FIG. 1B, storage devices A are in a clock state such that their gate terminal has the highest nominal value of the clock signal Vclk_hi, applied to it. With this applied gate voltage, a surface potential for the channel beneath storage devices 16 (A), $\phi_A$, is established. For this, it is desired that the surface potential beneath barrier devices 14 (B), $\phi_B$, also be fixed at a determined potential, Vstep, below $\phi_A$. Please note in the drawing that we have adopted the normal convention (for CCD circuits) of plotting increasing surface potential (rather than voltage level). The voltage Vstep thus defines the desired difference to be maintained between the surface potential underneath the storage devices 16 (A) and the barrier devices 14 (B). To maintain a desired Vstep between the two surface potentials, the invention seeks to control the voltage Vbias applied to the gate of barrier devices B.

FIG. 2 is a circuit diagram of one particular technique for controlling the bias voltage Vbias in a desirable way. The approach with this bias circuit 20 is to use a pair of MOS model transistors, 22A (MNA) and 22B (MNB), to serve as models or surrogates for the surface potential between the storage devices 16 (A) and barrier regions 14 (B). By having surrogate devices 22A, 22B that model the behavior of the surface potential, an appropriate Vbias can be developed for any given Vclk and any given process variations. That is because, in the preferred embodiment, the MOS model transistors 22A and 22B are formed on the same substrate as, and using the same process parameters as, the devices 14 and 16 in the main CCD array 10.

Current sources 24 are thus provided in each of the branches 21-1, 21-2 and 21-3 of biasing circuit 20. Current sources 24 serve to ensure that for a given structural configuration and/or dimension of a given implementation of MNA and MNB, each model transistor be biased at a turn on threshold voltage at a known current draw, Ibias. The current sources 24 therefore maintain the correct voltage relationship between the nodes N1 and N2 over a range of output current draws. This, in turn ensures that voltage Vbias is also maintained at a high impedance level.

More particularly, the first model transistor 22A (MNA) is configured such that its gate terminal and drain terminal are connected to one another and to a reference voltage equal to Vclk_hi (which may be the same as the supply voltage Vdd).

MNA is thus biased at threshold by a current source 24-A connected to its drain to provide a current, Ibias, such that VgsA is the same as the specified threshold voltage for transistor MNA. The threshold voltage for MNA is in turn designed to be the equivalent to the threshold voltage of the charge storage devices 16 (A). In this way, a voltage established at the drain terminal of transistor MNA, (labeled node N1 in the drawing), will have the same voltage level as the surface potential beneath the storage devices 16 (A).

To node N1 is connected a resistor 26, of resistance value R, which allows the circuit to drop voltage by a potential step value, Vstep, to node N2. Node N2 is thus established as a surrogate for the surface potential beneath barrier devices 14 (B). In particular, transistor MNB, with is source terminal also connected to a current source 24-D is designed to have a threshold voltage Vgs that is the equivalent of the barrier devices 14 (B) in the main CCD array. Thus, the potential Vbias that is necessary to bias the gates of devices B relative to devices A is established at the source terminal of transistor MNB. In other words, transistor MNB is biased at a threshold to establish the potential increase ($\phi_B$) from node N2 to the desired bias point.

The bias point will thus change as process parameters defining the threshold voltage for transistors MNA and MNB vary.

While this invention has been particularly shown and described with references to preferred embodiments thereof, it will be understood by those skilled in the art that various changes in form and details may be made therein without departing from the scope of the invention encompassed by the appended claims.

What is claimed is:

1. A charge transfer device comprising:
   a semiconductor substrate;
   a first charge transfer region formed in said semiconductor substrate, said first charge transfer region having a first input source, a first gate electrode, and a first output portion;
   a second charge transfer region coupled to the first charged transfer region and also formed in said semiconductor substrate, said second charge transfer region having a second input source coupled to said first output portion, a second gate input electrode in a second output portion; and
   a bias circuit for accepting a control voltage reference signal applied to the first charge transfer region, and for developing at least a first reference voltage $\phi_A$, the reference voltage corresponding to a surface potential of at least a portion of the first charge transfer region, and also developing therefrom a second reference voltage, $\phi_B$, the second reference voltage representing a surface potential of the second charge transfer region, and for further deriving a bias voltage to be applied to control the second charge transfer region.

2. A device as in claim 1 wherein the bias circuit additionally comprises:
   a first semiconductor model transistor connected to provide the first reference voltage $\phi_A$ at a first node N1, the first semiconductor transistor representing a model of the first charge transfer region such that the reference voltage $\phi_A$ at node N1 corresponds to surface potential under the first charge transfer region;
   a resistive circuit element, R, coupled between the first node N1 and a second node N2, such that a step voltage Vstep is maintained therebetween;
   a second semiconductor model transistor connected to the second node N2 and providing the bias voltage Vbias, such that the second semiconductor transistor represents a model of the second charge region, and so that the node N2 is maintained at a voltage indicative of the surface potential under the second charge transfer region; and
   wherein the bias voltage Vbias is in turn applied to control the second gate electrode of the second charge transfer region.

3. A device as in claim 1 wherein the bias circuit uses metal oxide semiconductor transistors.

4. A device as in claim 1 wherein the bias circuit is formed on the same substrate as first and second charge transfer regions.

5. A device as in claim 1 wherein the first transistor is a Metal Oxide Semiconductor (MOS) device with a gate terminal connected to a source terminal, and so that a bias voltage Vgsa developed across the gate and drain thereof corresponds to a threshold voltage of the first charge transfer region.

6. A device as in claim 1 wherein at least one of the model transistors is formed on the same substrate as at least one of the charge transfer regions.

7. A device as in claim 5 wherein the gate and source terminal of the first model transistor are connected to a supply voltage reference Vdd.

8. A device as in claim 7 wherein a bias current source maintains a step voltage Vstep across resistor R.

9. A device as in claim 1 wherein the drain of second model transistor is connected to a second node N2, and the gate and source terminal of the second model transistor are coupled together to provide the bias voltage, Vbias.

10. A device as in claim 1 wherein the first model transistor is biased at a threshold value by a current source, such that its gate source voltage Vgs is the same as a threshold voltage of the first charge transfer device.

11. A device as in claim 9 wherein the voltage provided at the output of the first model transistor at node N1 is a representation of the surface potential beneath the first charge transfer region.

12. A device as in claim 1 wherein the voltage at node N2 is a representation of the surface potential beneath the second charge transfer region.

13. A device as in claim 10 wherein the second model transistor is biased at a threshold point to establish a potential increase in voltage from node N2 to the bias voltage Vbias.

14. A device as in claim 1 wherein the first charge transfer region is a charge storage device.

15. A device as in claim 1 wherein the second charge transfer region is a barrier device.

* * * * *